United States Patent [19]

Sterling et al.

[11] 4,349,373
[45] Sep. 14, 1982

[54] PLASMA DEPOSITION OF GLASS OR ITS PRECURSOR

[75] Inventors: Henley F. Sterling, Great Dunmow; Miles P. Drake, Harlow, both of England

[73] Assignee: International Standard Electric Corporation, New York, N.Y.

[21] Appl. No.: 201,948

[22] Filed: Oct. 29, 1980

Related U.S. Application Data

[63] Continuation of Ser. No. 37,790, May 10, 1979, abandoned.

[30] Foreign Application Priority Data

May 30, 1978 [GB] United Kingdom ............... 24187/78

[51] Int. Cl.³ ..................... C03C 17/02; C03C 17/245
[52] U.S. Cl. ..................................... 65/60.8; 65/3.12; 65/3.2; 427/39; 427/137
[58] Field of Search ................. 427/38, 163, 167, 237, 427/39; 350/96.3, 96.31; 65/3.12, 3.2, 60.8

[56] References Cited

U.S. PATENT DOCUMENTS

| 3,485,666 | 12/1969 | Sterling et al. | 427/39 |
| 3,655,438 | 4/1972 | Sterling et al. | 427/39 X |
| 4,125,389 | 11/1978 | King | 65/3.12 |
| 4,145,456 | 3/1979 | Küppers et al. | 427/38 |
| 4,145,458 | 3/1979 | Koenings et al. | 427/39 |
| 4,262,035 | 4/1981 | Jaeger et al. | 427/39 |

FOREIGN PATENT DOCUMENTS 2712993 10/1977 Fed. Rep. of Germany .
2721198 11/1977 Fed. Rep. of Germany .
1104935 3/1968 United Kingdom .

Primary Examiner—Richard V. Fisher
Attorney, Agent, or Firm—John T. O'Halloran; Robert P. Seitter

[57] ABSTRACT

The vitreous material, e.g. silica, is deposited on the inner surface of the tube from a hot, intense, inductive plasma, which plasma is formed by utilization of wavelengths substantially longer than the diameter of the plasma. The process may be employed in the production of preform tubes or step or graded index optical fiber manufacture by gradually varying the contents of the vapor introduced into the plasma.

8 Claims, 6 Drawing Figures

PLASMA DEPOSITION OF GLASS OR ITS PRECURSOR

This is a continuation of application Ser. No. 037,790, filed May 10, 1079, now abandoned.

BACKGROUND OF THE INVENTION

This invention relates to inductive low pressure radio frequency plasma reactions, and in particular to a plasma process for the deposition of glassy material onto a solid surface.

The inductive radio frequency plasma has been known for many years. The essential feature of the inductive discharge is that the power is introduced into the gas phase by inductive coupling and hence the conductor paths in the gas form closed paths within the container. This provides a hot intense plasma and has the advantage that no internal electrodes are required nor are there the problems with large potential drops, as can occur with capacitive coupling, at the walls of the containing vessel.

The term 'radio frequency' as used herein is understood to include microwave frequencies.

An inductive discharge, or H-discharge, is produced by the magnetic field (H) of the exciting coil, unlike a capacitive discharge or E-discharge which is relatively diffused and is produced by electrostatic fields. It has been found that the H & E discharges become indistinguishable as the wavelength of the exciting radiation becomes comparable with the dimension of the discharge.

At low pressures the discharge tends to be most intense at the walls of a containing tube. At higher pressure 500 Torr the discharge becomes more restricted to the center of the tube.

The use of H-discharges for chemical processing has been limited previously to the atmospheric plasma torch. This device is essentially a high power H-discharge which is generally operated in argon to ease power requirements and at 3-10 MHz. Such a plasma torch has been used in the past to produce ultra-pure silica. The reactants were introduced into the tail flame of the plasma, as oxygen and silicon tetrachloride in high concentration tend to extinguish the plasma. Silica produced by such a torch was in the form of sub-micron spheres which had to be collected and sintered to form clear glass. While such an arrangement has proved effective for performing many chemical reactions it does not lend itself readily to the production e.g. of optical fiber preforms, in which it is preferred to deposit material directly as a glassy layer so as to avoid an intermediate sintering process.

SUMMARY OF THE INVENTION

According to the present invention, there is provided a method of depositing a glass or its precursor by a radio frequency induced chemical vapor reaction using an inductively sustained plasma fed with gas at a pressure within the range 0.1 to 50 Torr, wherein the plasma discharge is such that its largest dimension is significantly less than the free space wavelength of the radio frequency employed to sustain the plasma, the plasma pressure and energy density being such that the deposit is non-porous.

BRIEF DESCRIPTION OF THE DRAWINGS

Embodiments of the invention will now be described with reference to the accompanying drawings in which.

DETAILED DESCRIPTION OF THE INVENTION

Figure 1:
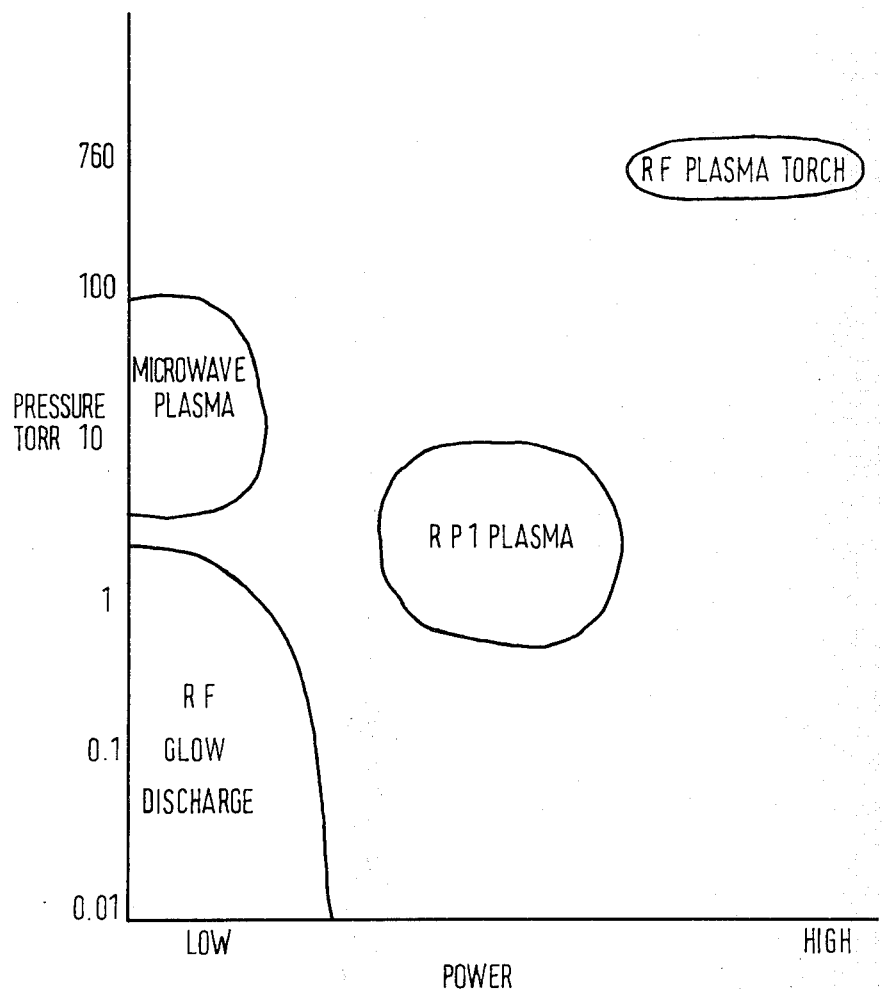
FIG. 1 is a schematic diagram indicating the operating regimes of various types of plasma.

Referring to FIG. 1, it can be seen that the various defined types of plasma appear with various combinations of gas pressure and input power. Thus the conventional E-discharge is achieved at relatively low pressures and low power. The H-discharge, however, occurs at intermediate pressures e.g. between 0.1 and 50 Torr and requires medium to high input power for its maintenance. The various forms of plasma are discussed in greater detail by G.I. Babat, J. Inst. Elec. Eng. 94 27–37 (June 1947).

Figure 2:
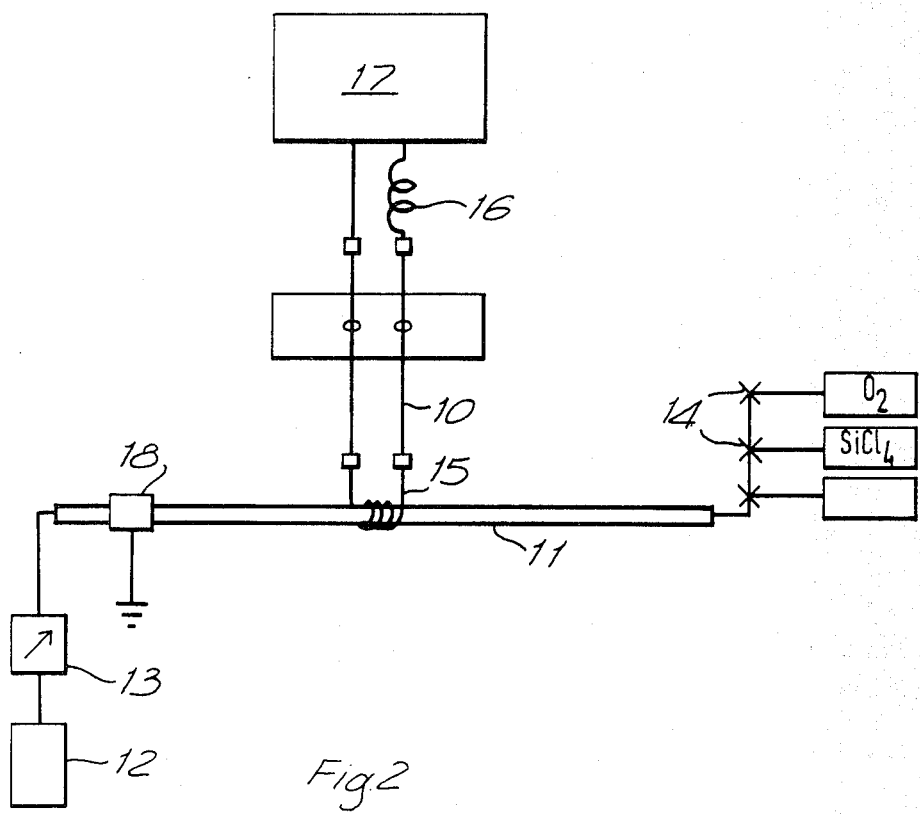
FIG. 2 is a schematic diagram of an inductive plasma deposition arrangement.

Referring to FIG. 2, there is shown an arrangement for the deposition of a solid material on the inner surface of an insulating, e.g. glass or silica, tube 11. The tube 11 is evacuated via a pump 12 coupled to a pressure gauge 13 and is supplied with reactant gases via valves 14. Thus, for example, if silica is to be deposited on the inner surface of a silica tube in the manufacture of optical fiber preforms, th reactant gases may be silicon tetrachloride ($SiCl_4$) and oxygen together with an inert carrier gas such as argon.

Radio frequency power is supplied to the tube 11 via a coil 15 coupled via a flexible RF feeder 10 and a loading coil 16 to a generator 17.

A grounded electrode 18 is provided at one end of the tube downstream from the coil 15 as it has been found that this aids the initiation of an inductive plasma within the coil 15 and causes any capacitive discharge to be confined downstream of the coil. It is essential that the lower potential or grounded end of the coil 15 faces the incoming gas flow to the system.

It has been found for example that, using a 2 inch silica tube, the mimimum power required to strike and sustain an inductive plasma at a frequency of 3 MHz is from 4 to 6 kW. However, as it is preferable to have an ample power reserve a 24 kW generator may be employed. Matching of the generator to the plasma is provided by adjustment of the loading coil 16 and, as will be apparent to those skilled in the art, by the particular design of the coil 15 surrounding the tube. In this respect it should be noted that, when an inductive plasma on H-discharge is struck within the tube, the parallel inductance effect of the plasma on the coil 15 reduces the effective inductance of that coil causing the generator frequency to rise. This is opposite to the effect observed with capacitors of E-discharge where striking of the plasma cause the generator frequency to fall.

Figure 3:
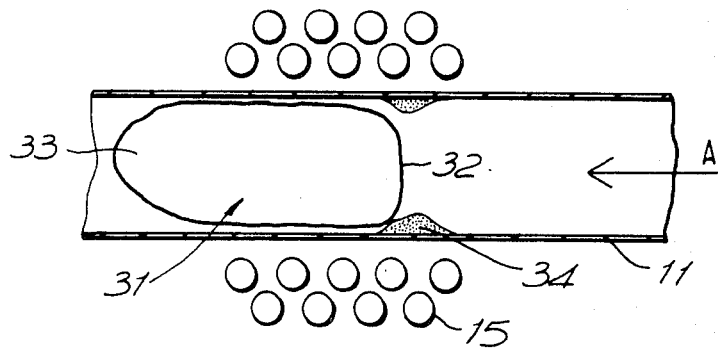
FIG. 3 indicates the plasma configuration obtained in the arrangement of FIG. 2.

Referring to FIG. 3, the plasma 31 is struck with the tube 11 evacuated to the desired pressure in the range 0.1 to 50 Torr by increasing the generator power until electrical breakdown of the gas occurs. The inductive plasma may then be sustained at a somewhat lower power level. As shown in FIG. 3, the plasma 31 is displaced from the center of the coil 15 by the gas flow along the direction of the arrow A forming a broad front 32 against the gas flow and having an extended tail portion 33. Solid material 34, e.g. silica, is deposited on the tube from the plasma forming a ring of material adjacent the front 32 of the plasma 31. Thus, by moving the coil 15 along the tube 11, or by moving the tube within the coil, a contiguous layer of material may be deposited along the inner surface of the tube. The generator power may be so controlled that, while maintaining the inductive plasma, the solid material 34 is deposited directly in a glassy condition without fusion of the silica tube 11 and without the need to sinter the deposited material. Relative movement of the coil 15 and the tube 11 prevent overheating and subsequent collapse of any one portion of the tube 11.

The technique is particularly advantageous for the manufacture of silica optical fiber preforms by the coated tube method. The various layers of doped and/or undoped silica may be deposited on the inner surfce of a silica tube without fusion of the tube and subsequent loss of tube geometry. The coated tube may then be collapsed into a preform tube and drawn into optical fiber in the normal way.

In a deposition process using the apparatus of FIG. 2, silica in glassy form may be deposited over a 40 cm length of 20 mm diameter silica tube by admitting 200 cc/min oxygen bubbled through silicon tetrachloride liquid at 20° C. and admitting an additional 200 cc/min of oxygen into the tube at a pressure of 7.0 Torr. Conveniently the work coil 16 may comprise a two layer coil, 5 turns on the first layer wound on a 3 cm former, and 3 turns on the second layer. The turns may be insulated with glass sleeving and the two layers separated e.g. with a silica tube. The inductive plasma may be maintained at 2.9 MHz at a power level sufficient to heat the tube to about 1000° C., the coil being reciprocated along the tube at a rate of 5 secs. per pass. This provides a deposition rate of glassy silica on the tube of 16 g/hour. Dopants commonly employed in the production of optical fibers may of course be included in the plasma to vary the refractive index of the deposited material.

It has been found that, using the arrangement of FIGS. 2 and 3, by adjusting the generator output and, if necessary, by local heating of the deposition tube an inductive plasma may be struck and conveniently confined to the region of the work coil at pressure up to 20 Torr. At pressures up to 50 Torr the tube diameter should be increased, i.e. above 20 mm, to improve matching and facilitate maintenance of the plasma.

Figure 4:
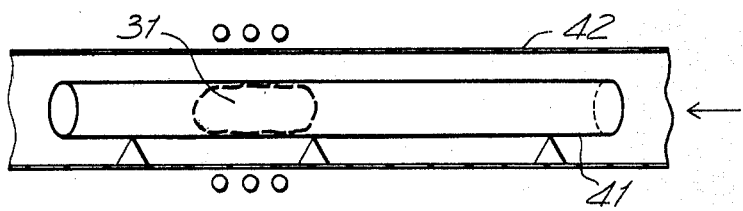
FIG. 4 shows an alternative deposition arrangement.

FIG. 4 shows an inductive plasma deposition arrangement for the plasma deposition of material by a tube-in-tube process in which a tube 41 on which material is to be deposited rests or is supported in an outer tube 42. This technique, when applied to the coating of a silica tube e.g. for optical fiber production, has the advantage that the tube 41 may be maintained at a temperature approaching its softening point without the risk of collapse due to the relatively low pressure of the plasma. It is found with this arrangement that the plasma confines itself to the inside of the tube 41 and that deposition takes place therefore only on the inside of this tube. By this means the temperature of the inner tube may be raised to 1300° C. without risk of distortion.

Figure 5:
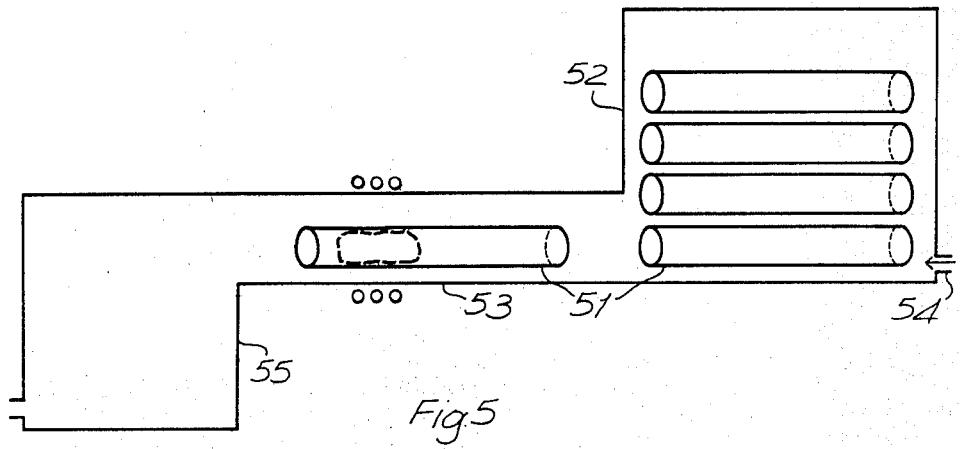
FIG. 5 shows a further type of deposition arrangement.

FIG. 5 shows a modification of the arrangement of FIG. 4 in which provision is made for the treatment of a plurality of tubes 51 by a semi-continuous tube-in-tube process. The tubes 51 to be treated are stacked in a vacuum tight storage chamber 52 communicating with a tube 53 in which the tubes 51 are to be treated. Reactant gases are supplied to the system via an inlet 54 into the storage chamber 52. To effect inductive plasma deposition, the bottom tube 51 of the stack is pushed e.g. by a piston (not shown) into the tube 53 and plasma coated with the desired material, e.g. silica or doped silica, as previously described. When coating has been completed the next tube 51 of the stack is pushed into the tube 51 ejecting the previously coated tube 51 into a further storage chamber 55. The process is then continued until all the tubes 51 have been treated.

Figure 6:
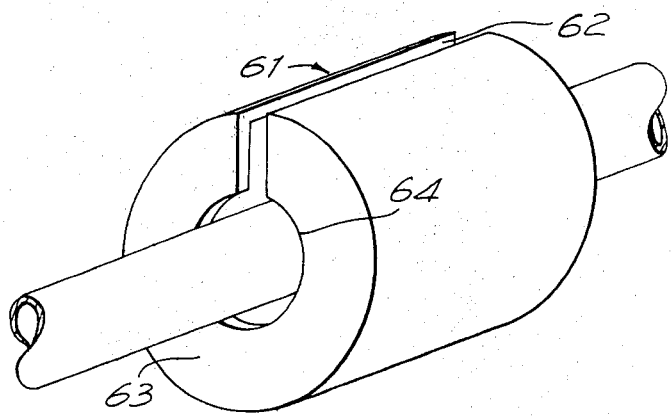
FIG. 6 shows an alternative arrangement employing a radio-frequency concentrator.

In the arrangement of FIG. 6, a current concentrator or RF transformer 61 is employed to localize and intensify the H-discharge. Hitherto it has not been possible to apply such a current concentrator, to plasma systems operating at atmospheric pressures.

Such a transformer can be employed to effectively isolate the high voltage associated with the primary coil 15 from the plasma region and also provide a step down—high current path which can be used to stabilize and concentrate the plasma to the required deposition zone. The concentrator, which should be water cooled, comprises a conductive, e.g. copper, hollow cylinder provided with a longitudinal slot 62 and closed at one end by a plate 63 provided with a keyhole slot 64 communicating with the slot 62. The discharge tube is placed in the keyhole slot 64 around which an intense RF current is induced by the surrounding work coil (not shown). As the concentrator is isolated from the generator it may be grounded thus eliminating any stray capacitive discharges or maintained at any desired potential. Other forms of concentrator known to those skilled in the art may of course be used.

The following examples illustrate the invention:

EXAMPLE 1

A silica deposition tube of 21 mm internal diameter was mounted in a vacuum pumped flow system of the type shown in FIG. 2. The tube was pumped by a rotary vacuum pump through a liquid nitrogen cold trap, the tubing between pump and deposition tube being designed to give a high flow conductance.

A coil was constructed from two layers of $\frac{1}{4}''$ copper tube wound with five turns on the inside layer and three turns on the outside. The coil was insulated with glass fiber sleeving and isolation between the two layers was achieved by means of a silica tube.

The coil was placed over the silica tube and connected by means of flexible water cooled leads to the tank circuit of a 35 kW RF generator. Provision was made for reciprocation of the coil along 50 cm of the silica tube.

As stray capacitor effects resulting from discharge from high RF voltage parts of the coil were found to promote sooty deposition incorporated in the glassy deposit, the coil was arranged with the grounded end on the inside of the coil and facing the incoming gas stream. Stray discharges were then more or less confined to the downstream end where no unreacted silicon tetrachloride existed.

The silica tube was pumped down to less than 0.01 Torr. With the pump operating 200 sccm of $O_2$ was admitted causing the pressure in the tube to rise to 2

Torr. The voltage to the oscillating valve was then increased briefly to 3 kv when an intense white plasma appeared within the tube confined to the coil region.

The frequency before the plasma appeared was 4.54 MHz and on appearance of the plasma this increased to 4.62 MHz as the inductance of the coil was reduced by the inductive plasma.

The voltage to the valve was then adjusted until the tube temperature rose to 1100° C.

Silicon tetrachloride was then admitted by bubbling oxygen through the liquid at 22° C. at a rate of 300 sccm causing the pressure to rise to 3 Torr. After one hour the tube was removed and it was found by weighing that 16 g of silica had been deposited in a glassy form.

EXAMPLE II

A coil and concentrator of the type shown in FIG. 6 were used. A ten turn coil was wound as before (Ex. 1) on an internal diameter of 55 mm. A water cooled copper concentrator was inserted and grounding provided to it by means of a switch. Note that in some applications the concentrator may be maintained at any chosen RF potential with respect to earth.

The coil and concentrator were connected to the tank circuit of the generator. The voltage on the valve was increased as before until an H-discharge appeared in the region of concentrator field. The voltage was then adjusted to give a tube temperature of 1200° C. The concentrator was then grounded and all trace of stray capacitive discharges disappeared.

Silicon tetrachloride and germanium tetrachloride were admitted in the usual way to cause a layer of doped $SiO_2/GeO_2$ to be deposited on the tube.

While we have described above the principles of our invention in connection with specific apparatus it is to be clearly understood that this description is made only by way of example and not as a limitation to the scope of our invention as set forth in the objects thereof and in the accompanying claims.

We claim:

1. A method of depositing a glass or its precursor on a substrate surface by a radio frequency induced chemical vapor reaction using an inductively maintained plasma fed with gas at a pressure within the range 0.1 to 50 Torr, wherein stray capacitive discharges are eliminated from unreacted gases and wherein the plasma discharge is such that its largest dimension is significantly less than the free space wavelength of the radio frequency employed to maintain the plasma, the plasma pressure and energy density being such that the deposit is non-porous.

2. The method as claimed in claim 1, and in which said plasma is confined in a straight insulating tube on the inner surface of which deposition is effected.

3. The method as claimed in claim 1 and in which the plasma is localized by means of an RF step down transformer or concentrator.

4. A method as claimed in claim 3, wherein the concentrator is grounded.

5. The method as claimed in claim 3, wherein the concentrator is maintained at a potential with respect to ground.

6. A method of depositing undoped and/or doped silica in glassy form on the inner surface of a silica tube, including supplying to the tube vapours containing at least the element of silica at a pressure between 0.1 and 20 Torr, striking and maintaining an inductive plasma within the tube so as to cause silica deposition on the inner surface of the tube, excluding capacitive effects from regions of the tube containing unreacted vapours, and traversing the discharge along the tube so as to provide a uniform silica coating, wherein the plasma discharge is such that its largest dimension is significantly less than the free space wavelength of the radio frequency employed to maintain the plasma, the plasma pressure and energy density being such that the tube temperature rises to between about 1000° C. and 1300° C. so that the deposition of uniform non-porous material is effected.

7. The method as claimed in claim 6, and in which the plasma is provided by oxygen and silicon tetrachloride vapor.

8. The method as claimed in claim 6 or 7, and in which the silica tube is confined in an outer vacuum tight silica tube.

* * * * *